(12) United States Patent
Thees et al.

(10) Patent No.: US 11,322,587 B2
(45) Date of Patent: May 3, 2022

(54) METHOD OF PROCESSING A POWER SEMICONDUCTOR DEVICE

(71) Applicant: Infineon Technologies Dresden GmbH & Co. KG, Dresden (DE)

(72) Inventors: Hans-Juergen Thees, Dresden (DE); Stefan Loesch, Lohmen (DE); Marc Probst, Radeberg (DE); Tom Richter, Langebrueck (DE); Olaf Storbeck, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/900,882

(22) Filed: Jun. 13, 2020

(65) Prior Publication Data
US 2020/0395443 A1    Dec. 17, 2020

(30) Foreign Application Priority Data
Jun. 14, 2019  (DE) .......................... 102019116218.1

(51) Int. Cl.
*H01L 29/06* (2006.01)
*H01L 29/739* (2006.01)
*H01L 29/66* (2006.01)

(52) U.S. Cl.
CPC .... *H01L 29/0696* (2013.01); *H01L 29/66333* (2013.01); *H01L 29/7395* (2013.01)

(58) Field of Classification Search
CPC ............. H01L 29/0696; H01L 29/7395; H01L 29/66333; H01L 29/7803; H01L 29/66734;
(Continued)

(56) References Cited

U.S. PATENT DOCUMENTS

2016/0293757 A1* 10/2016 Xie ................ H01L 21/823487
2019/0067280 A1*  2/2019 Balakrishnan ...... H01L 29/0843
(Continued)

FOREIGN PATENT DOCUMENTS

DE   102014108913 A1   12/2015
DE   102016112016 A1    1/2018
(Continued)

*Primary Examiner* — Mohammad M Hoque
(74) *Attorney, Agent, or Firm* — Murphy, Bilak & Homiller, PLLC

(57) ABSTRACT

A power semiconductor device includes a control cell for controlling a load current. The control cell is electrically connected to a load terminal structure on one side and to a drift region on another side. The drift region includes dopants of a first conductivity type. The control cell includes: a mesa extending along a vertical direction and including: a contact region having dopants of the first conductivity type or of a second conductivity type and electrically connected to the load terminal structure, and a channel region coupled to the drift region; a control electrode configured to induce a conduction channel in the channel region; and a contact plug including a doped semiconductive material and arranged in contact with the contact region. An electrical connection between the contact region and load terminal structure is established by the contact plug, a portion of which projects beyond lateral boundaries of the mesa.

14 Claims, 13 Drawing Sheets

(58) Field of Classification Search
CPC ........... H01L 29/41725; H01L 29/0856; H01L 29/0676; H01L 29/0657; H01L 29/7813; H01L 29/66348; H01L 29/407; H01L 29/083; H01L 29/417; H01L 29/7397; H01L 29/7396; H01L 29/74; H01L 29/7827; H01L 29/861; H01L 29/6609; H01L 29/66363; H01L 29/66666
USPC ........................................................ 257/139
See application file for complete search history.

(56) References Cited

U.S. PATENT DOCUMENTS

2019/0081180 A1* 3/2019 Park .................... H01L 29/4908
2020/0258941 A1* 8/2020 Lee ......................... H01L 45/08

FOREIGN PATENT DOCUMENTS

DE      102016112017 A1    1/2018
DE      102017130092 A1    6/2019

* cited by examiner

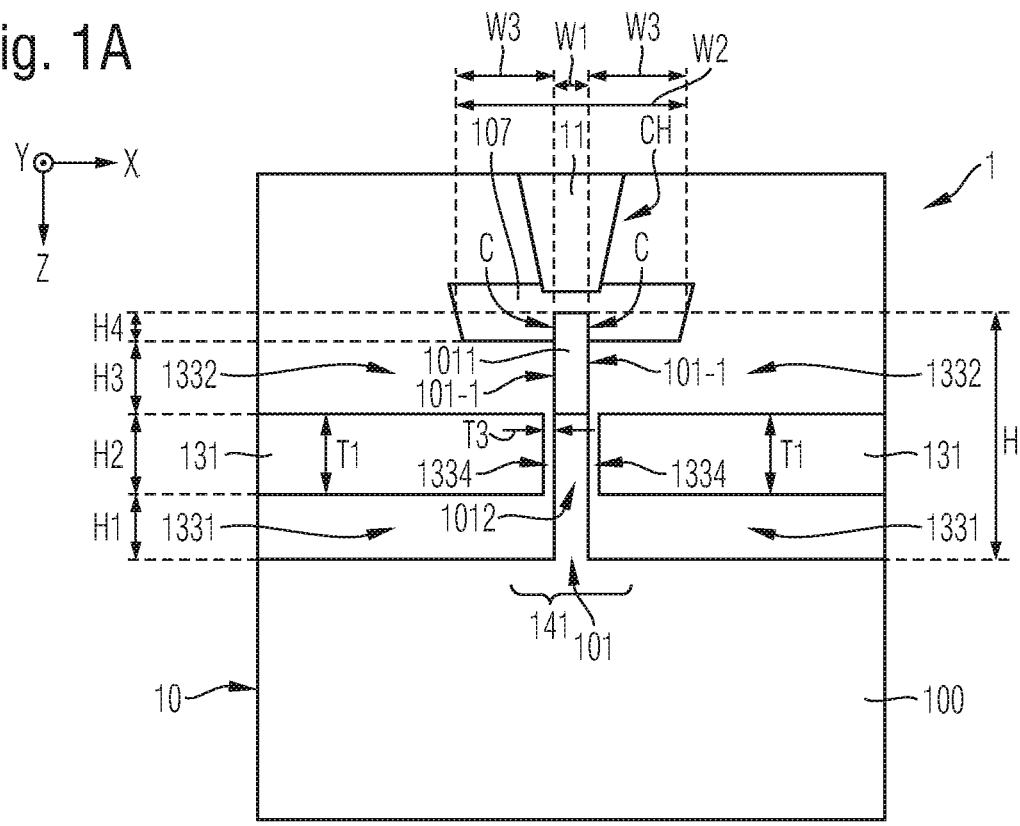
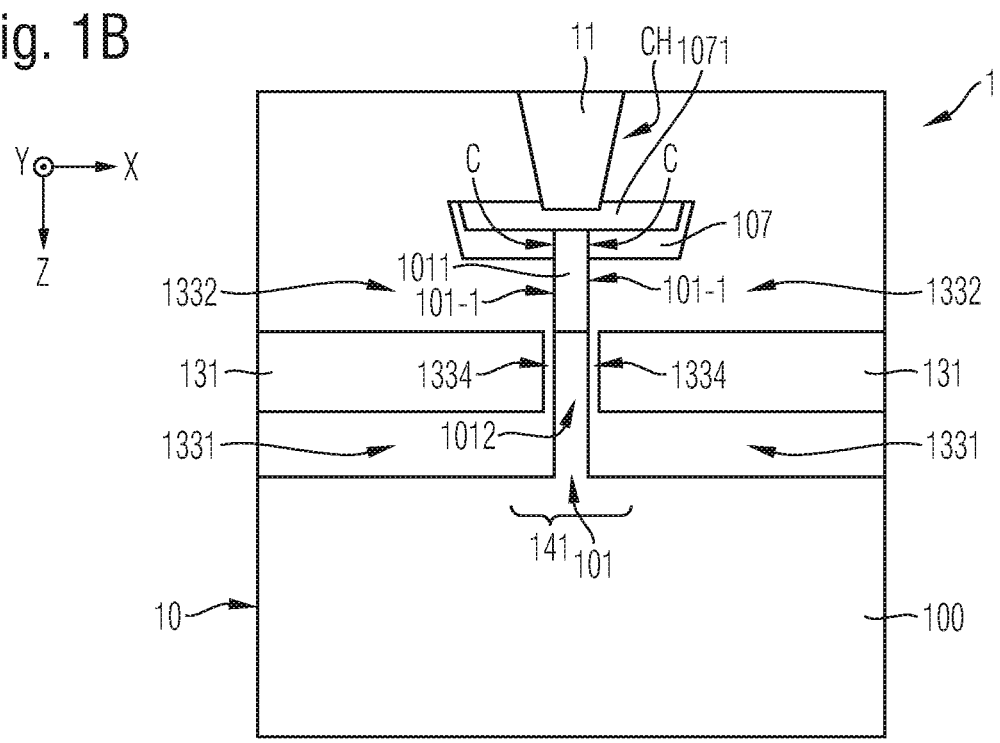

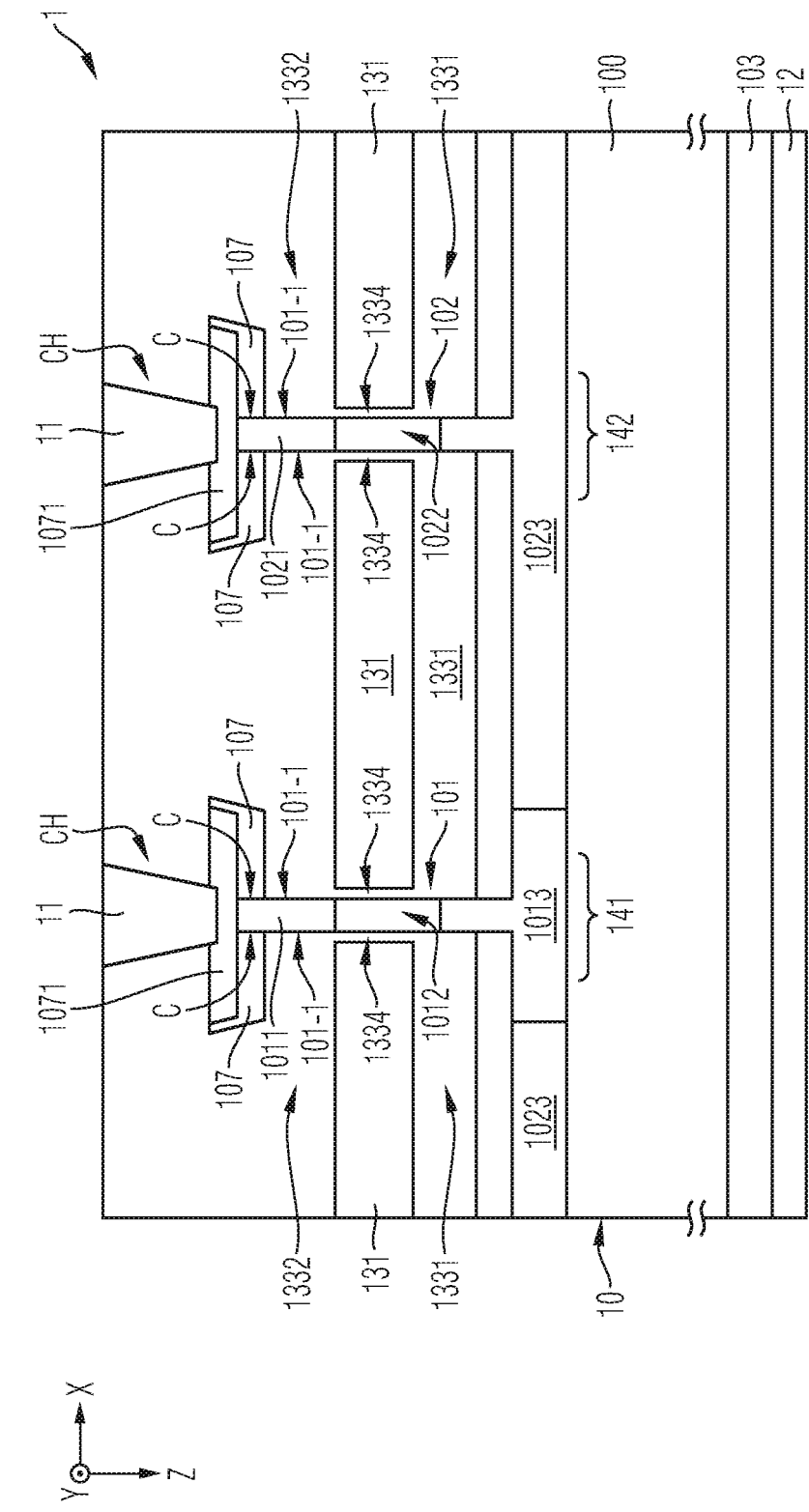

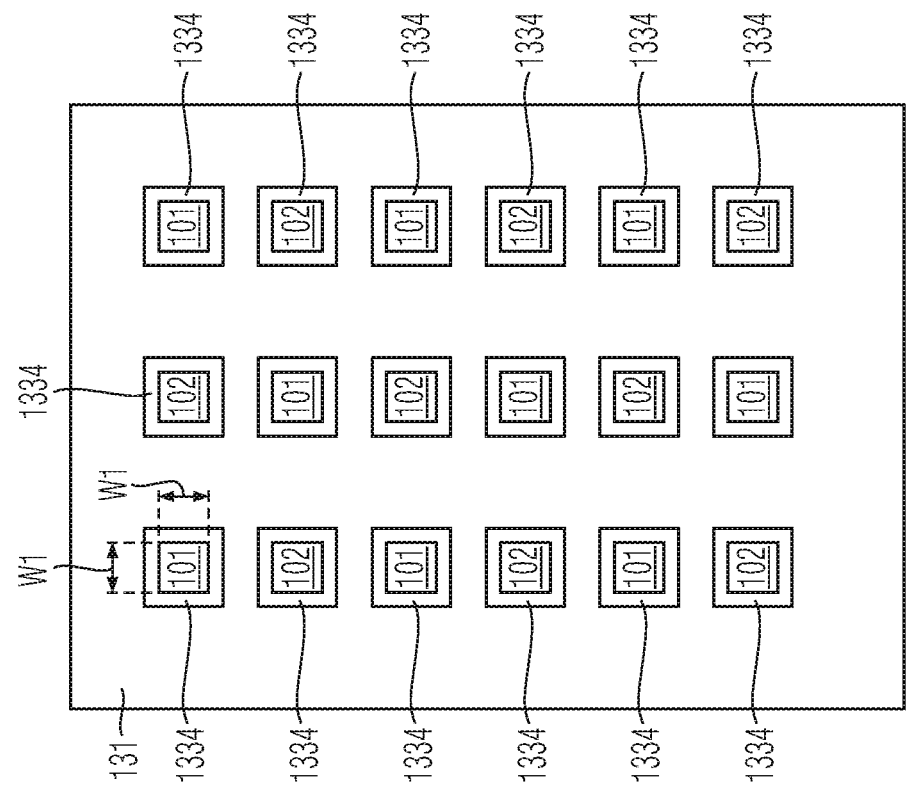
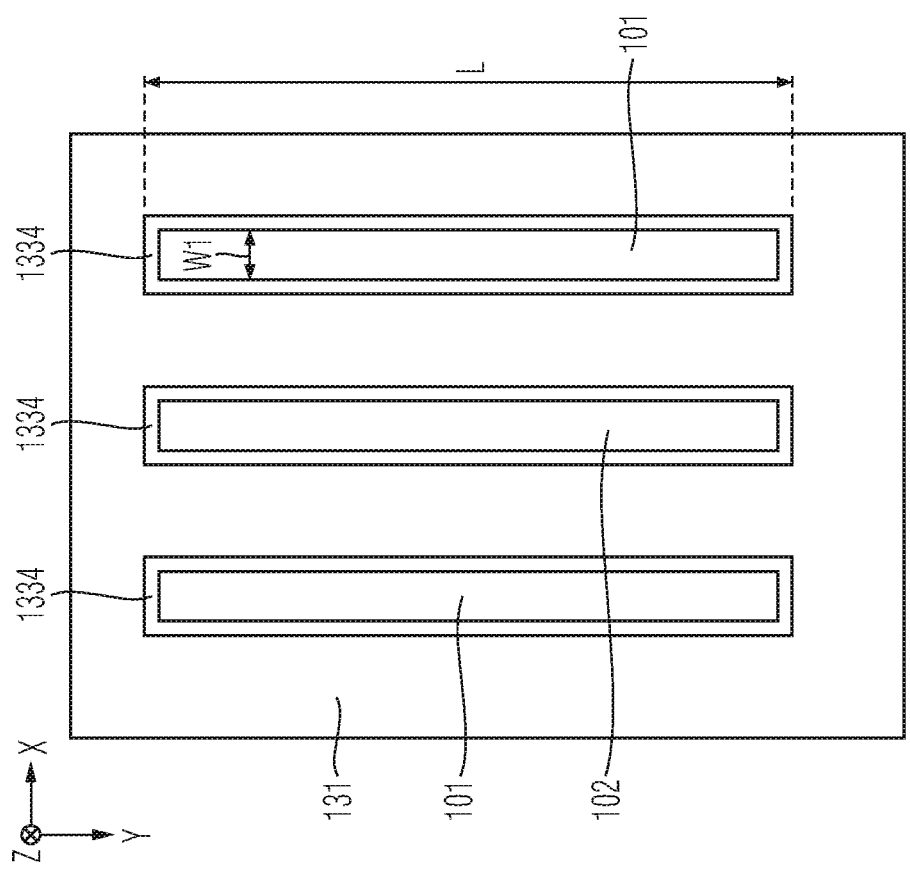
Fig. 5B
Fig. 5A

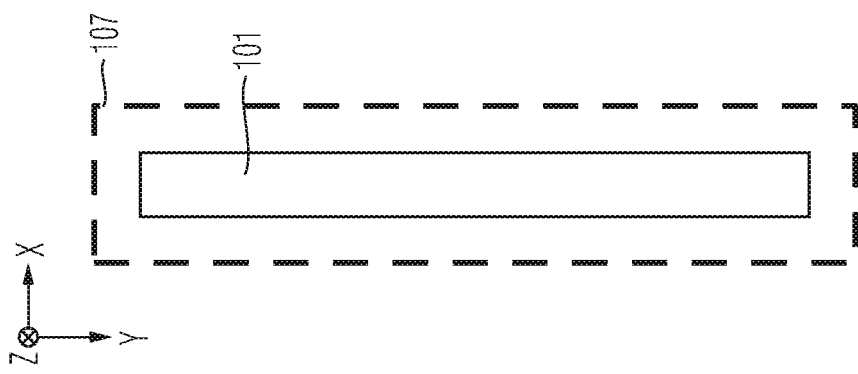
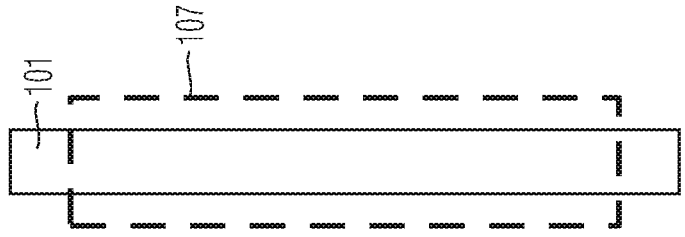
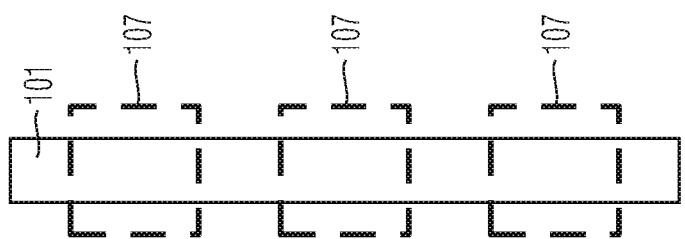
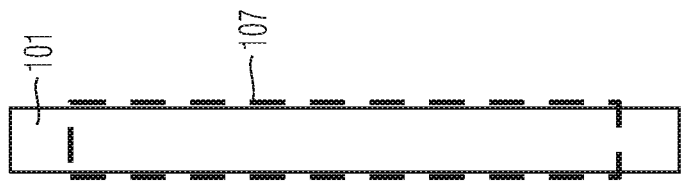

METHOD OF PROCESSING A POWER SEMICONDUCTOR DEVICE

TECHNICAL FIELD

This specification refers to embodiments of a power semiconductor device and to embodiments of a method of processing a power semiconductor device. In particular, this specification refers to aspects of a power semiconductor device including a control cell that is configured to induce a conduction channel in a semiconductor mesa.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device.

Further, in case of a controllable power semiconductor device, such as a transistor, the load current path may be controlled by means of an insulated control electrode, commonly referred to as gate electrode.

For example, upon receiving a corresponding control signal from, e.g., a driver unit, the control electrode may set the power semiconductor device in one of a forward conducting state and a forward blocking state by inducing or cutting-off a conduction channel in a channel region of a semiconductor mesa. The mesa may be electrically connected with a metallic load terminal structure of the power semiconductor device, e.g., by means of a doped contact region of the mesa.

It is generally desirable to provide a reliable device having low power losses. To this end, it can be desirable to provide for a reliable and low-resistance electrical contact between a load terminal structure and a semiconductor mesa of the device.

Further, it can be desirable to provide for a reliable and cost-efficient processing method for such a power semiconductor device.

SUMMARY

Aspects described herein relate to a semiconductive contact plug being arranged at least partially between a load terminal structure and a semiconductor mesa. Creating such a contact plug may be achieved by means of a self-aligned process.

According to an embodiment, a power semiconductor device comprises a control cell for controlling a load current, the control cell being electrically connected to a first load terminal structure of the power semiconductor device on the one side and electrically connected to a drift region of the power semiconductor device on the other side, the drift region comprising dopants of a first conductivity type. The control cell comprises:
a mesa extending along a vertical direction and including:
a contact region having dopants of the first conductivity type or of a second conductivity type complementary to the first conductivity type and being electrically connected to the first load terminal structure, and a channel region being coupled to the drift region;
a control electrode being configured for inducing a conduction channel in the channel region; and
a contact plug comprising a doped semiconductive material, the contact plug being arranged in contact with the contact region,
wherein an electrical connection between the contact region and the first load terminal structure is established by means of the contact plug. For example, a portion of the contact plug may project beyond lateral boundaries of the mesa. The contact plug may be arranged at least partially between the contact region and the first load terminal structure. Further, for example, when viewed in a vertical cross-section, the contact plug may contact the mesa on more than one surface, such as, e.g., on the top of the mesa and on both (upper portions of the) sidewalls of the mesa.

According to a further embodiment, a method of processing a power semiconductor device comprises:
providing a semiconductor body;
recessing portions of the semiconductor body so as to create a plurality of mesas protruding from a remaining bulk portion of the semiconductor body;
forming a first insulation layer on the bulk portion in between the mesas;
forming a gate oxide layer on the mesas;
depositing a gate electrode layer on the first insulation layer and on the gate oxide layer;
forming a second insulation layer filling a space between neighboring mesas, wherein the second insulation layer is formed in such a way that portions of the gate electrode layer are exposed at a level above the mesas; and
recessing the exposed portions of the gate electrode layer down to a defined recess depth so as to create recesses adjacent to respective upper portions of the mesas.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIGS. 1A-1C each schematically and exemplarily illustrate a section of a vertical cross-section of a power semiconductor device in accordance with one or more embodiments;

FIGS. 2A-2B each schematically and exemplarily illustrate a section of a vertical cross-section of a power semiconductor device in accordance with one or more embodiments;

FIGS. 5A-5B each schematically and exemplarily illustrate a section of a horizontal cross-section of a power semiconductor device in accordance with one or more embodiments; and FIGS. 6A-6D each schematically and exemplarily illustrate a top view of a relative arrangement of a mesa and one or more contact plug in accordance with one or more embodiments.

DETAILED DESCRIPTION

Figure 1C:
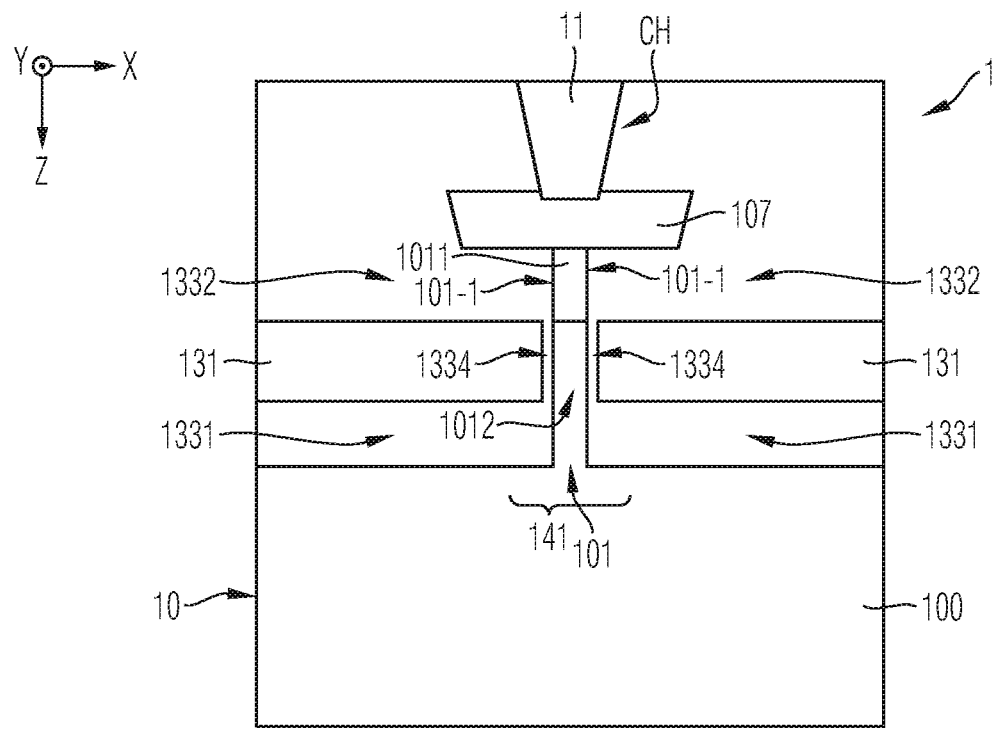

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other. Also, the radial direction R mentioned below can be a lateral, i.e., horizontal direction, e.g., formed by an arbitrary, e.g., linear, combination of the first lateral direction X and the second lateral direction Y.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a single cell, a stripe cell, a cellular (also referred to as "needle" or "columnar") cell or another cell configuration, e.g., a power semiconductor device that may be used within a power converter or a power supply. Thus, in an embodiment, the power semiconductor device described herein can be configured to carry a load current that is to be fed to a load and/or, respectively, that is provided by a power source.

For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated IGBT cell, a monolithically integrated RC IGBT cell, a monolithically integrated MOSFET cell, a monolithically integrated thyristor cell, a monolithically integrated Gate turn-off thyristor (GTO) cell and/or derivatives thereof. Such diode/transistor cells may be integrated in a power semiconductor module. A plurality of such equally configured cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, the power semiconductor device described herein can be a single-chip power semiconductor device and can be intended for high currents, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more.

For example, the power semiconductor device described herein may be a single semiconductor chip exhibiting a single cell configuration, a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor-based data processing.

FIG. 1A schematically and exemplarily illustrates a section of a vertical cross-section of a power semiconductor device 1 in accordance with one or more embodiments. For example, the power semiconductor device 1 may have a vertical configuration and may be configured for conducting a load current between a first load terminal structure 11 arranged at a front side (the upper part shown in FIG. 1A) and a second load terminal structure (not illustrated) arranged at a backside. For example, the backside and the second load terminal structure may be situated below the section depicted in FIG. 1A. Hence, the power semiconductor device 1 may be configured such that (in an on-state of the power semiconductor device 1) the load current flows mainly along the vertical direction Z.

It should be noted in this context that the section of the power semiconductor device 1 shown in FIG. 1A includes only a small portion of the first load terminal structure 11, namely, a portion that is arranged inside a contact hole CH. For example, the contact hole CH may be filled with a metal that forms part of the first load terminal structure 11. For example, the first load terminal structure 11 may further comprise a front side metallization layer. Such a front side metallization layer may in turn be electrically connected with a first external load terminal, such as an emitter terminal or a source terminal, of the power semiconductor device 1 (not illustrated).

Similarly, the second load terminal structure that may be arranged at the backside may comprise, e.g., a backside metallization that is electrically connected with a second external load terminal, such as a collector terminal or a drain terminal of the power semiconductor device 1 (not illustrated).

The section of the vertical cross-section of the power semiconductor device 1 depicted in FIG. 1A includes a control cell 141 that is configured for controlling the load current 15. For example, a plurality of such control cells 1 may be provided in an active area of the power semiconductor device 1.

The control cell 141 is electrically connected to the first load terminal structure 11 on one side (namely, the upper side). Further, the control cell 141 is electrically connected to a semiconductor drift region 100 of the power semiconductor device 1 on the other (lower) side. The drift region 100 forms a part of a semiconductor body 10 and comprises dopants of a first conductivity type, e.g., the n-type.

The control cell 141 comprises a semiconductor mesa 101 which forms a part of the semiconductor body 10, The mesa 101 extends from a bulk portion of the semiconductor body 10 (which includes the drift region 100) in parallel to the vertical direction Z. In other words, in a vertical cross-section along the vertical direction Z, as depicted in FIG. 1A, a main extension direction of the mesa 101 may be parallel to the vertical direction Z.

In FIG. 1A, the cross-section is along each of the vertical direction Z and the first lateral direction X. Regarding a form of the mesa with respect to the second lateral direction Y (i.e., perpendicular to the cross-section), it should be noted that the mesa 101 may, for example, have fin shape with a substantial extension along this direction Y, For example, the mesa 101 may extend throughout an entire active region (or through a substantial part of the active region) of the power semiconductor device 1 along the second lateral direction Y.

Alternatively, the lateral extension of the mesa 101 along the second lateral direction Y may be, for example, equal to or similar to a lateral extension W1 of the mesa 101 (also referred to as a horizontal mesa width W1) along the first lateral direction X, as illustrated in FIG. 1A. In the latter case, the mesa 101 may in fact have the form of a pillar exhibiting, e.g., a quadratic or circular shape in a lateral cross-section along the first and second lateral directions X, Y. This will be further elucidated below with reference to FIG. 5B.

In an embodiment, the horizontal mesa width W1 may be less than 100 nm, such as in a range from 20 nm to 60 nm. For example, as schematically illustrated in FIG. 1A the mesa 101 may be spatially confined, in the first lateral direction X (i.e., perpendicular to the current flow direction Z of the load current in the mesa 101) by an insulation structure 1331, 1332, 1334 comprising, e.g., one or more oxides. The mesa 101 may exhibit a total extension W1 of less than 100 nm, such as in the range from 20 nm to 60 nm, in said direction X.

Regarding vertical dimensions, the mesa 101 may have a total mesa height H of at least 50 nm, such as in the range from 50 nm to 600 nm, for example.

The mesa 101 includes, at an upper end, a contact region 1011 having dopants of the first conductivity type (e.g., n-type) or of a second conductivity type (e.g., p-type) complementary to the first conductivity type. Further, the mesa 101 has a channel region 1012 extending vertically from the contact region 1011 to a lower end of the mesa 101 and being coupled to the drift region 100 at the lower end of the mesa 101. For example, the horizontal mesa width W1 mentioned above and in the following, may be a minimal horizontal extension of the channel region 1011.

A control electrode 131 is provided in the vicinity of the channel region 1012. The control electrode 131, which may also be referred to as gate electrode, is configured for inducing a conduction channel in the channel region 1012, e.g., in dependence on a control signal provided via an external control terminal (or gate terminal) to which it is electrically connected (not illustrated).

The control electrode 131 is formed by a conductive layer, which may, for example, comprise (or consist of) polysilicon or a metal. The conductive layer 131 may be formed by a conformal deposition step. For example, the conductive layer 131 may be a flat layer extending mainly along the first and second horizontal directions X, Y. In other words, the conductive layer 131 may have a larger extension in the horizontal direction X, Y than in the vertical direction Z. As illustrated in FIG. 1A, the conductive layer 131 has a vertical layer thickness T1. For example, said vertical layer thickness T1 may be a minimal vertical layer thickness T1. For example, the vertical layer thickness T1 may be a layer thickness of the conductive layer 131 as measured in the middle between two neighboring mesas.

In an embodiment, the vertical layer thickness T1 is equal to or smaller than half the mesa height H, such as equal to or smaller than one third of the mesa height H. For example, in case the mesa height is in the range from 50 nm to 600 nm, the vertical layer thickness T1 may be in the range from 15 nm to 300 nm, for example.

Additionally or alternatively, the vertical layer thickness T1 may be equal to or larger than the horizontal mesa width W1, such as larger than twice or even three times the horizontal mesa width W1.

In accordance with the embodiment of FIG. 1A, a vertical sidewall of the conductive layer 131 may be separated from the channel region 1012 of the mesa 101 by means of a gate insulation structure, such as a gate oxide 1334. Sometimes, such an arrangement is referred to as a "sidewall gate" configuration.

For example, a gate oxide layer thickness T3 of the gate oxide 1334 between the conductive layer 131 and the channel region 1012 may be in the range from 5 nm to 50 nm, such as in the range from 5 nm to 20 nm.

The vertical extension of the conduction channel in the channel region 1012 is mainly defined by the vertical extension H2 of a portion of the gate oxide 1334 separating the conductive layer 131 from the mesa 101. For example, the vertical extension H2 of the portion of the gate oxide 1334 separating the conductive layer 131 from the mesa 101 is equal to or smaller than half the mesa height H, such as equal to or smaller than one third of the mesa height H. In the present exemplary embodiment, said vertical extension H2 may be equal to the minimal vertical layer thickness T1, However, in other embodiments, this need not be the case, i.e., it is generally possible that the vertical extension H2 of the portion of the gate oxide 1334 separating the conductive layer 131 from the mesa 101 may be larger or smaller than the minimal vertical layer thickness T1. This will be explained further below, e.g., with reference to FIGS. 3E(a) and 3E(b).

Further, in accordance with the embodiment illustrated in FIG. 1A, said portion of the gate oxide 1334 separating the conductive layer 131 from the mesa 101, 102 is equal to or larger than twice a horizontal width W1 of the mesa 101, 102, such as equal to or larger than three times the horizontal width W1 of the mesa 101, 102.

Further, as illustrated, a bottom oxide 1331 may be arranged below the conductive layer 131, i.e., between the conductive layer 131 and a bulk of the semiconductor body 10. For example, the bottom oxide 1331 may have a vertical extension H1 that is equal to or smaller than one third of the mesa height H. Additionally or alternatively, the vertical extension H1 of the bottom oxide 1331 may be equal to or larger than the horizontal width W1 of the mesa 101.

The power semiconductor device 1 according to the embodiment of FIG. 1A further comprises a top insulation structure 1332, The top insulation structure 1332 is arranged above the conductive layer 131, i.e., further away from the bulk of the semiconductor body 10 than the conductive layer 131.

The top insulation structure 1332, the gate oxide 1334, and the bottom 1331 together may form the insulation structure 1331, 1332, 1334 referred to above.

The contact region 1001 is electrically connected to the first load terminal structure 11 by means of a contact plug 107. The contact plug 107 is arranged in contact with the contact region 1011 and at least partially between the contact region 1011 of the mesa 101 and the first load terminal structure 11, such that it separates the contact region 1011 from the first load terminal structure 11. An electrical connection between the contact region 1011 and the first load terminal structure 11 is thus established by means of the contact plug 107.

For example, the contact plug 107 comprises or consists of a doped semiconductive material, such as at least one of the following materials: polysilicon, single crystalline or amorphous silicon, epitaxially grown silicon, silicon carbide, or silicon-germanium. In another embodiment, the contact plug 107 may comprise (or consist of) a metal.

In an embodiment in accordance with FIG. 1A, a portion of the contact plug 107 projects horizontally beyond lateral boundaries 101-1 of the mesa 101, This is to say that, in a cross-section view like the one shown in FIG. 1A, a portion of the contact plug 107 horizontally projects (on each side) further than the mesa 101, namely, for example, further than a respective vertical sidewall of the mesa 101. In other embodiments, this may not necessarily be the case (cf. FIG. 6D and the corresponding description below).

Further in accordance with FIG. 1A, a horizontal width W2 of the contact plug 107 (e.g., at the level of an upper end of the mesa 101) amounts at least to the sum of a horizontal mesa width W1 and twice the vertical layer thickness T1 of the conductive layer forming the control electrode 131. For example, in a vertical cross-section as shown in FIG. 1A and at the level of an upper end of the mesa 101, the contact plug 107 may project on each side beyond a respective lateral boundary 101-1 of the mesa 101 by a distance W3 that is equal to or larger than the vertical thickness T1 of the conductive layer 131. In an embodiment, the bottom of the contact plug 107 projects on each side beyond the respective lateral boundary 101-1 of the mesa 101 by a distance that corresponds to a sum of the vertical thickness T1 of the conductive layer 131 and the gate oxide layer thickness T3.

In an embodiment in accordance with FIG. 1A, the top insulation structure 1332 has a vertical extension H3 between the contact plug 107 and an upper end of the control electrode 131 wherein said vertical extension H3 is equal to or smaller than one third of the mesa height H. Additionally or alternatively, said vertical extension H3 may be equal to or larger than the horizontal width W1 of the mesa 101, such as equal to or larger than twice the horizontal mesa width W1. For example, said vertical extension H3 may be measured between a bottom of the contact plug 107 and the upper end of the control electrode 131, as schematically indicated in FIG. 1A.

For example, as illustrated in FIG. 1A, a portion of the contact plug 107 may extend laterally adjacent to the mesa 101 so as to form a lateral contact C between the contact plug 107 and a sidewall of the mesa 101, Correspondingly, the contact region 1011 of the mesa 101 may exhibit a vertical overlap H4 (defining a vertical extension of said lateral contact C) with the contact plug 107. For example, in an embodiment, the vertical overlap H4 may amount to at least the horizontal mesa width W1.

In the exemplary embodiment shown in FIG. 1A, such a lateral contact C is formed on each side of the mesa 101, such that the contact plug 107 is arranged on the mesa 101 (and centered on the mesa 101) in what may be referred to as a "saddle configuration." It should be noted, however, that in other embodiments, the contact plug 107 does not necessarily form such a lateral contact C with a sidewall of the mesa 101, In other words, in these other embodiments, the vertical overlap H4 referred to above may be zero. This will be further explained below with reference to FIG. 1C.

FIG. 1B shows another exemplary embodiment of a power semiconductor device 1, which differs from the power semiconductor device 1 of FIG. 1A in that the contact plug 107 comprises a shielded contact portion 1071 that is arranged in contact with the first load terminal structure 11. For example, an electrical contact between first load terminal structure 11 and the contact plug 107 may thus be improved. The contact region 1011 of the mesa 101 may be arranged in contact with the silicided contact portion, as illustrated in FIG. 1B. However, this need not be the case in other embodiments.

FIG. 1C shows yet another variant embodiment of a power semiconductor device 1, which differs from the power semiconductor device 1 of FIG. 1A in that the contact plug 107 does not form a lateral contact C with a sidewall of the mesa 101. Instead, the contact plug 107 is arranged only on top of the mesa 101, In other words, in the variant according to FIG. 10, the contact plug 107 does not have a "saddle configuration" referred to above in connection with FIG. 1A.

In an embodiment in accordance with FIG. 2A, the power semiconductor device 1 comprises two or more control cells 141, 142, which are in each case configured as described above with reference to FIGS. 1A-C, For example, a plurality of such control cells 141, 142 may be provided, each of which are electrically connected to a common (i.e., a same) first load terminal structure 11 (not illustrated).

Further, in an embodiment, a (common) control terminal may be provided, which may be is electrically connected with each of the control electrodes 131 of the plurality of control cells 141, 142 (not illustrated). This is to say that each of the control electrodes 131 may be provided with a same external control signal, which is received by the common control terminal.

Figure 2B:
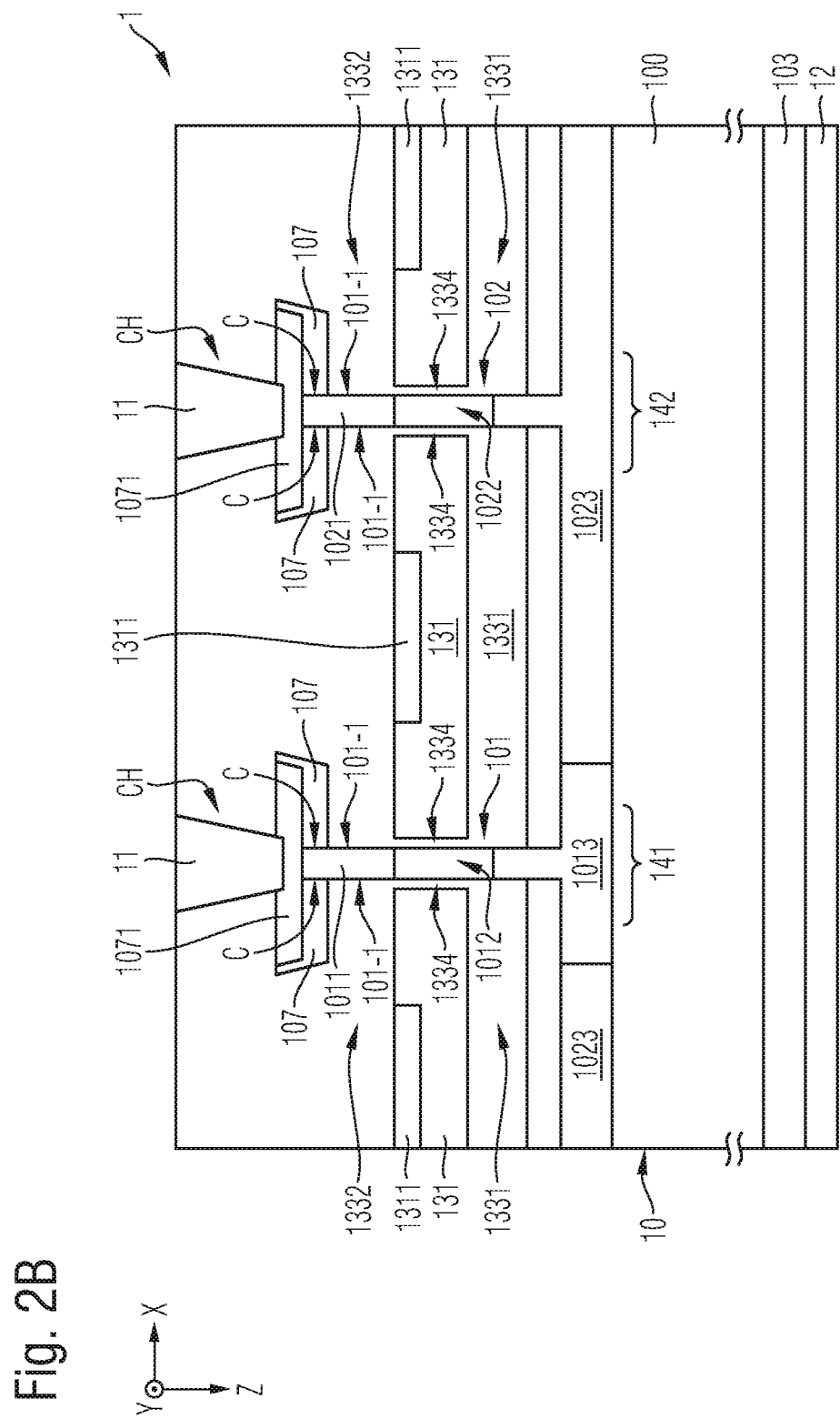

In an embodiment, a first control cell 141 and a second control cell 142 may be provided, wherein the above description of the first control cell 141 of the power semiconductor devices 1 of FIGS. 1A-B may generally also apply to each of a first control cell 141 and a second control cell 142 of the embodiment shown in FIG. 2A. In turn, what will be described in the following with reference to FIGS. 2A-B, may analogously apply to the embodiment of FIGS. 1A-C.

Accordingly, the first control cell 141 of the power semiconductor device 1 shown in FIG. 2A comprises a first mesa 101 which includes a first contact region 1011 and a first channel region 1012. The second control cell 142 comprises a second mesa 102 which includes a second contact region 1021 and a second channel region 1022.

Regarding dimensions, what has been stated above with reference to FIGS. 1A-B, may also apply to the embodiment of FIG. 2A. Thus, for example, a respective horizontal mesa width W1 of the first and second mesas 101, 102 may be less than 100 nm, such as in a range from 20 nm to 60 nm. For example, the mesas 101, 102 may be spatially confined in the direction X (i.e., perpendicular to the current flow direction Z of the load current in the mesa 101, 102) by an insulation structure 1331, 1332, 1334 comprising one or more oxides. The mesas 101, 102 may exhibit a total extension of less than 100 nm, such as in the range from 20 nm to 60 nm, in said direction X.

In an embodiment in accordance with FIG. 2A, the first contact region 1011 of the first mesa 101 may have dopants of the first conductivity type (e.g., n-type), whereas the second contact region 1021 of the second mesa 102 may have dopants of a second conductivity type that is complementary to the first conductivity type (e.g., p-type).

Further, at a backside of the power semiconductor device 1, the semiconductor body 10 may comprise a backside emitter region 103, which may have dopants at a higher dopant concentration as compared to the drift region 100. For example, the backside emitter region 103 may have dopants of the second conductivity type (e.g., p-type). In this case, the power semiconductor device 1 may have an IGBT configuration.

The backside emitter region 103 may be arranged in contact with a second load terminal structure 12, e.g., in the form of a backside metallization that is arranged on the backside of the power semiconductor body 10.

In addition, the drift region 100 may comprise a buffer region (also referred to as field stop region; not illustrated) of dopants of the first conductivity type, wherein the buffer region comprises dopants of the first conductivity type at a higher dopant concentration than the remaining portions of the drift region 100. Modes of realization of such a buffer region are well known to those skilled in the art and will therefore not be explained in detail here.

In accordance with one or more embodiments, the power semiconductor device 1 may be configured as a power semiconductor device 1 (such as an IGBT) having fully depletable channel regions 1012, 1022. Accordingly, each of the first channel region 1012 and the second channel region 1022 may be fully depletable of charge carriers of at least one charge carrier type in dependence on a control signal (i.e., a gate voltage) provided to the control electrode(s) 131.

For example, by "fully depletable" it shall be understood that the dimensions and the doping of the channel regions 1012, 1022 (as well as the dimensions of the gate oxide layer 1334) are such that, depending on a gate voltage that is applied to the control electrode(s) 131, a space charge region may be induced in a respective channel regions 1012, 1022 from each side, which extends further than half of the mesa width W1. Hence, at least a portion of the channel region 1012, 1022 extending in the vicinity of the control electrode(s) 131 may be depleted of charge carriers over its entire horizontal extension W1.

For example, the channel regions 1012, 1022 may be doped with dopants of the second conductivity type (e.g., p-doped). In another embodiment, the channel regions 1012, 1022 may have dopant of the first conductivity type (e.g., n-type). In another embodiment, the second channel region 1022 may comprise dopants of a conductivity type different from the first channel region 1012.

For example, at least a central portion (with regard to the vertical extension) of each of the channel regions 1012, 1022 may have essentially the same dopant concentration of dopants of the first conductivity type as the drift region 100, e.g., a basic doping of a semiconductor substrate. External of said central portion, the doping may differ from the one of the drift region 100, e.g., as a result of diffusion of dopants from the semiconductor regions that are arranged above and below the channel region 1012, 1022. For example, in this embodiment, the control electrode 131 may comprise a semiconductor material (e.g., polysilicon) having dopants of the second conductivity type (e.g., p-type).

In an embodiment, the first contact region(s) 1011 may have dopants of the first conductivity type, whereas the second contact region(s) 1012 may have dopants of the second conductivity type.

The first control cell(s) 141 may thus be configured for controlling a current of charge carriers of the first conductivity type (e.g., an electron current). The first control cell(s) 141 may be configured for nearly completely suppressing a flow of charge carriers of the second conductivity type (e.g., a hole current) through the fully depleted first channel region 1012 in an on-state of the power semiconductor device. The first control cell(s) 141 may be configured such that the current through the first mesa(s) 101 caused by charge carriers of the first conductivity type is at least 10 times larger than the current through the first mesa(s) 101 caused by charge carriers of the second conductivity type in an on-state (or forward conducting state) of the power semiconductor device 1. The second control cell(s) 142 may be configured for suppressing a flow of charge carriers of the first and second conductivity type (e.g., a hole current) through the fully depleted second channel region 1022 in an on-state (or forward conducting state) of the power semiconductor device, but enable an outflow of charge carriers of the second conductivity type—and hence support a fast removal of an electron-hole plasma from the drift region 100—during turn-off or in the forward blocking state of the device 1. To this end, the first and second control cells 141, 142 may have different threshold voltages (e.g., gate-emitter threshold voltages) for the onset of a channel formation for electrons/holes in the first and second channel regions 1012, 1022.

As schematically illustrated in FIG. 2A, the semiconductor body 10 may further comprise a first plateau region 1013 and a second plateau region 1023. The first plateau region 1013 may be in contact with the first channel region 1012 and may exhibit dopants of the first conductivity type. The second plateau region 1023 may exhibit dopants of the second conductivity type and may be coupled to the second channel region 1022 such that the second plateau region 1023 is electrically coupled to the second contact region 1021 in case the second channel region 1022 is in conduction mode for carriers of the second conductivity type. In an embodiment, the second plateau region 1023 may be in contact with the second channel region 1022.

For further explanations of functional and structural features of power semiconductor devices having a fully depletable channel region, it is referred, for example, to the published German patent applications DE 10 2014 108 913 A1, DE 10 2016 112 017 A1, and DE 10 2016 112 016 A1. The power semiconductor device 1 of the present invention may be generally configured as described therein, wherein one or more contact plugs 107 as described in the present specification may be additionally provided. Further, power semiconductor devices as described in the aforementioned patent applications may be produced using one or more process steps according to the present specification.

FIG. 2B shows another exemplary embodiment of a power semiconductor device 1, which differs from the power semiconductor device 1 of FIG. 2A in that the control electrodes 131, which are in the present example formed by polysilicon layers, comprise a silicided control electrode portion 1311. The silicided control electrode portion 131 is arranged in contact with the top insulation structure 1332. For example, a gate resistance of the power semiconductor device 1 may be reduced due to the silicided control electrode portion 1311.

In what follows, processing steps of a method of processing a power semiconductor device 1 will be explained with reference to FIGS. 3A-H. For example, a power semiconductor device 1 as described above with reference to FIGS. 1A-2B in various embodiments may be produced by means of such processing steps. Hence, what has been explained in the above regarding features of the power semiconductor device 1 of the present invention may apply analogously to the processing method that will be presented in the following, and vice versa.

Figure 3A:
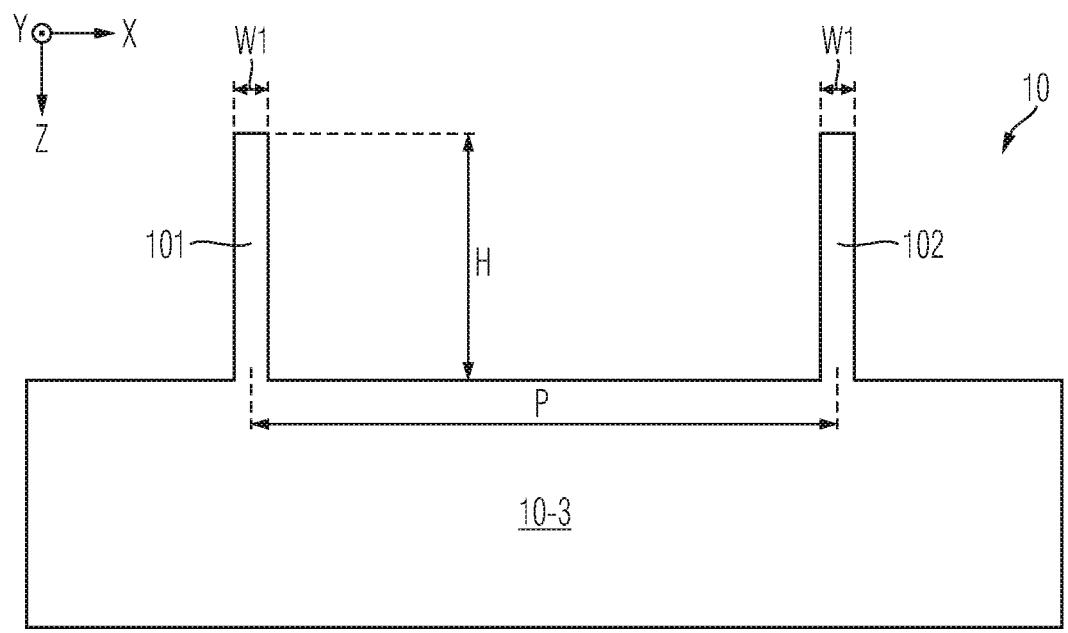
FIGS. 3A-3H schematically and exemplarily illustrate a series of processing steps of a method in accordance with one or more embodiments.

Starting with FIG. 3A, in a first step, a power semiconductor body 10 may be provided. For example, the power semiconductor body 10 may be provided in the form of a wafer of, e.g., silicon or silicon carbide.

Further with reference to FIG. 3A, portions of the semiconductor body 10 may be recessed so as to create a plurality of mesas 101, 102 protruding from a remaining bulk portion 10-3 of the semiconductor body 10. For example, this may be achieved by means of a lithography/etch sequence or by means of so-called double patterning process, as is in principle well known in the art. Also, an isotropic etch step for further thinning the mesas 101, 102 after initial mesa formation may be included. Generally, it should be noted that a horizontal mesa width W1 of the mesas 101, 102 may be further reduced by one or more optional process steps after the initial formation of the mesas 101, 102. The exemplary dimensions and dimension relations mentioned in the following may apply to the mesa width W1 after the initial creation of the mesas 101, 102 (in the recessing step) and/or to a smaller mesa width W1 which may result from one or more of such further mesa thinning steps.

With regard to dimensions, it may be provided that the mesas 101, 102 exhibit a horizontal mesa width W1, which may be in the range from 20 nm to 100 nm, for example. A mesa height H (as measured between upper ends of the mesas 101, 102 and an upper surface of the recessed bulk portion 10-3 of the semiconductor body 10) may be in the range from 50 nm to 600 nm, for example. Further, a pitch P between neighboring mesas 101, 102 may be, e.g., in the range from 50 nm to 10 μm.

A part of said bulk portion 10-3 of the semiconductor body 10 may form the drift region 100 of the power semiconductor device 1 referred to above.

Figure 3B:
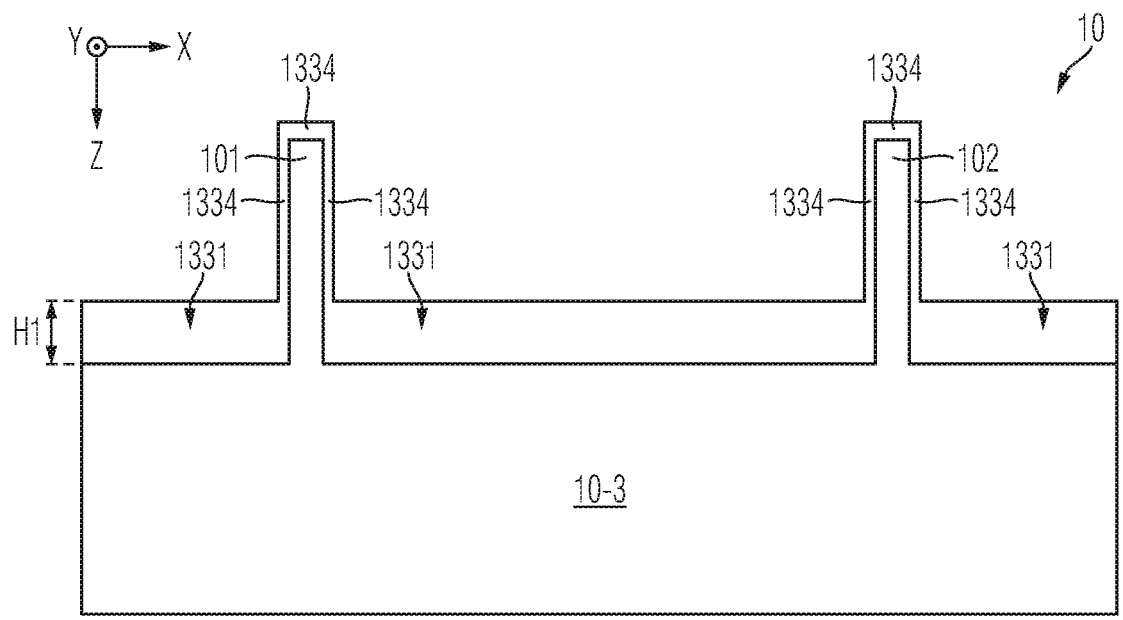

Turning now to FIG. 3B, in a further step, a first insulation layer 1331 may be formed on the bulk portion 10-3 in between the mesas 101, 102. The first insulation layer 1331 may form the bottom oxide 1331 of the power semiconductor device 1 referred to above. Accordingly, in an embodiment, the first insulation layer 1331 may have a vertical extension H1 that is equal to or smaller than one third of the mesa height H. Additionally or alternatively, the vertical extension H1 of the bottom oxide 1331 may be equal to or larger than the horizontal mesa width W1.

For example, the formation of the first insulation layer 1331 may comprise an oxide deposition, optionally combined with a back etch process, and further optionally combined with a CMP planarization step. For example, a resulting oxide thickness H1 may be in the range from 10 nm to 150 nm.

As further illustrated in FIG. 3B, a gate oxide layer 1334 may be formed on the mesas 101, 102. For example, a thickness of the gate oxide layer 1334 may be in the range from 5 nm to 50 nm.

Figure 3C:
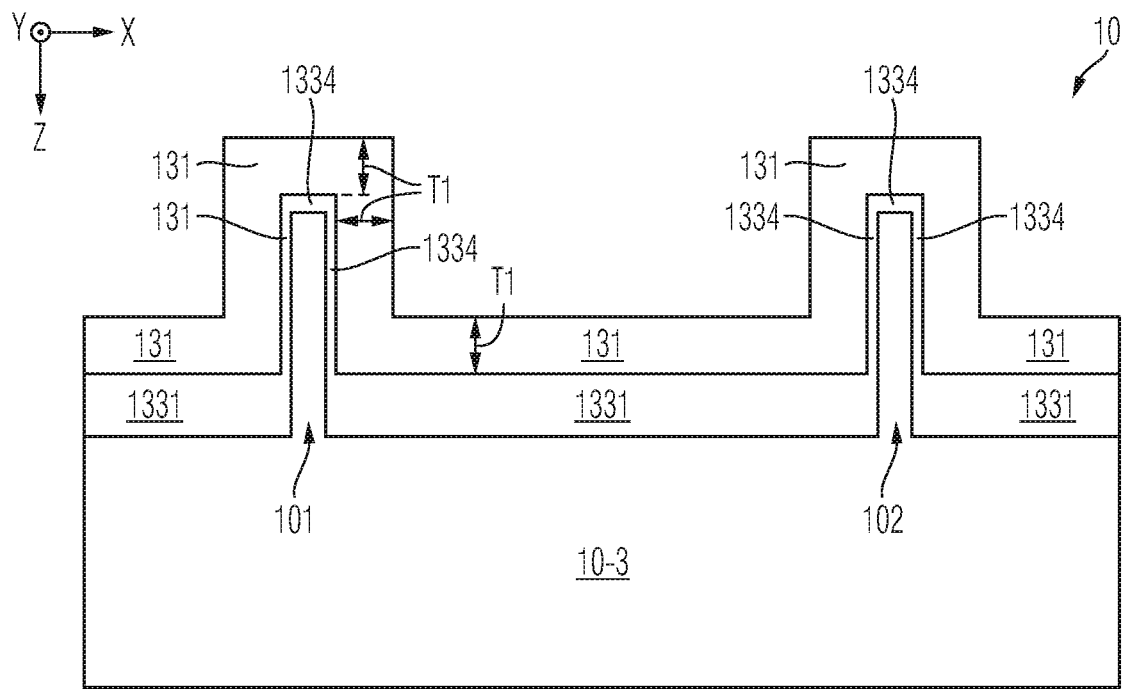

In accordance with FIG. 3C, the processing method may further comprise a step of depositing a gate electrode layer 131 on the first insulation layer 1331 and on the gate oxide layer 1334, For example, at least a part of the gate electrode layer 131 may form at least a part of the control electrode(s) 131 of the power semiconductor device 1 referred to above. For example, the gate electrode layer 131 may comprise or consist of a doped polysilicon or amorphous silicon. In an alternative embodiment, the gate electrode layer 131 may be a metal layer.

For example, a layer thickness T1 of the deposited gate electrode layer 131 may be in the range from 50 nm to 500 nm. In an embodiment, the layer thickness T1 of the deposited gate electrode layer 131 is equal to or smaller than one third of the mesa height H. In an embodiment, the layer thickness T1 of the deposited gate electrode layer 131 is equal to or smaller than one third of the distance between two mesas in order to not completely fill the space. For example, the layer thickness T1 may be a vertical layer thickness of the gate electrode layer 131 as measured in the middle between two neighboring mesas 101, 102.

Figure 3D:
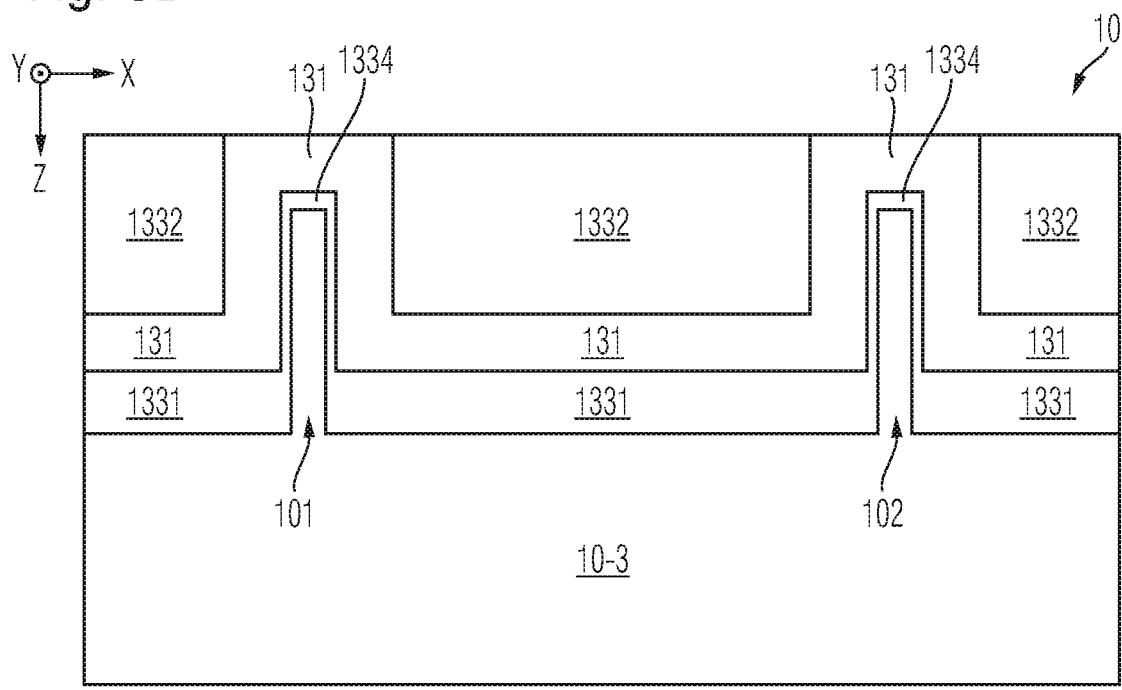

Next, referring to FIG. 3D, the method may comprise a step of forming a second insulation layer 1332-1 which fills a space between neighboring mesas 101, 102. The second insulation layer 1332-1 may be formed in such a way that portions of the gate electrode layer 131 are exposed at a level above the mesas 101, 102, as illustrated in FIG. 3D. This may be achieved, for example, by means of an oxide deposition, which may be combined with a CMP step for planarization and/or a back etch process to expose said portions of the gate electrode layer 131. For example, at least a part of the second insulation layer 1332-1 may form at least a part of the top insulation structure 1332 of the power semiconductor device 1 mentioned above.

Figure 3E:
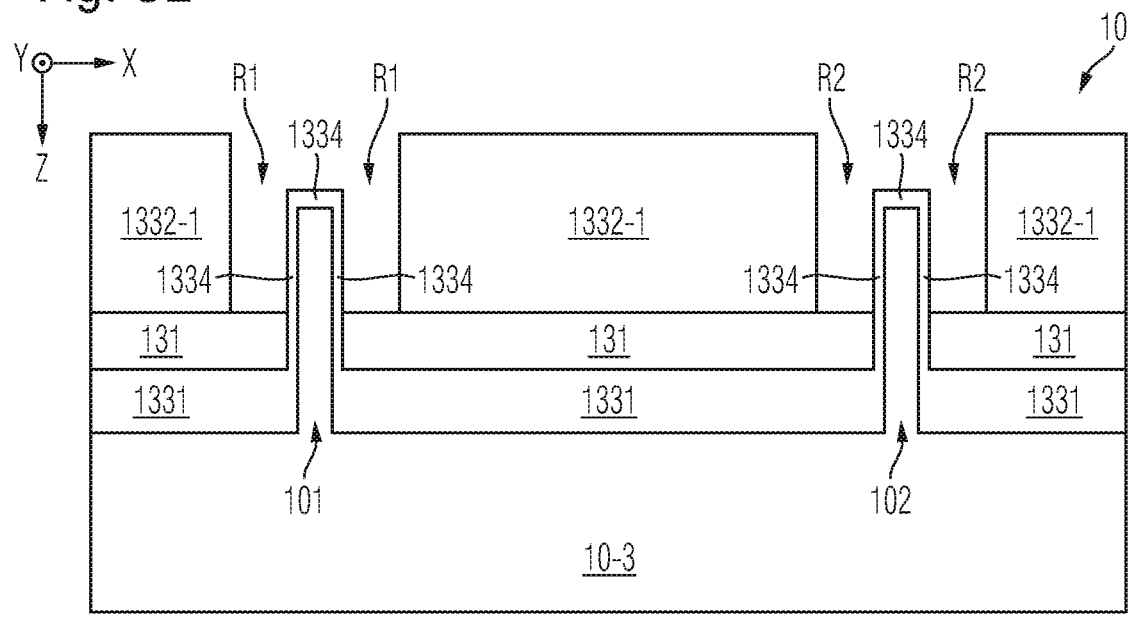
Figure 3E:
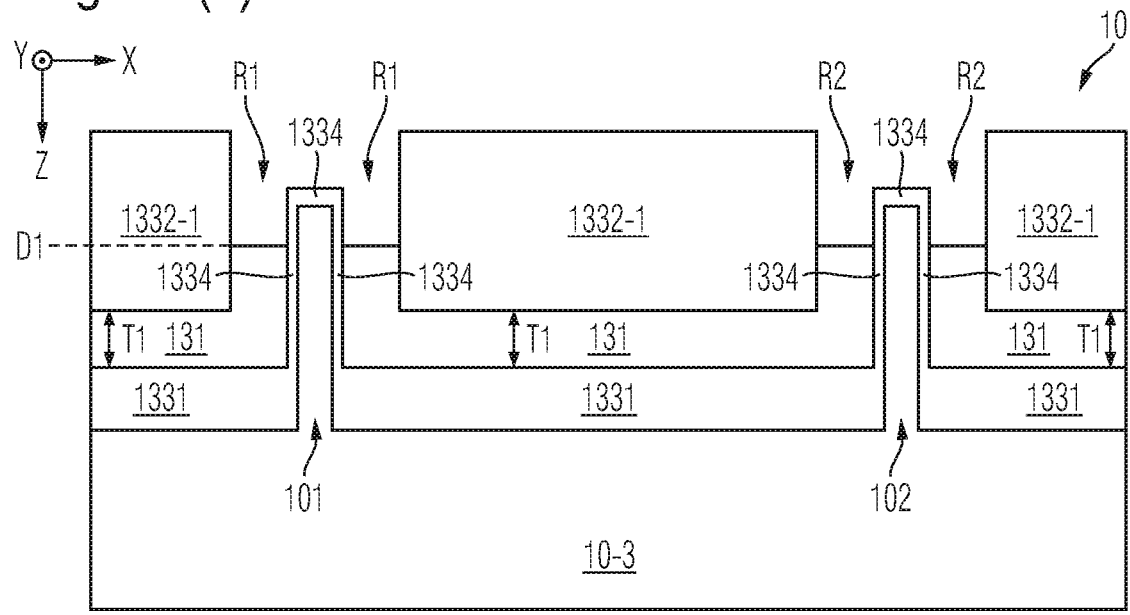
Figure 3E:
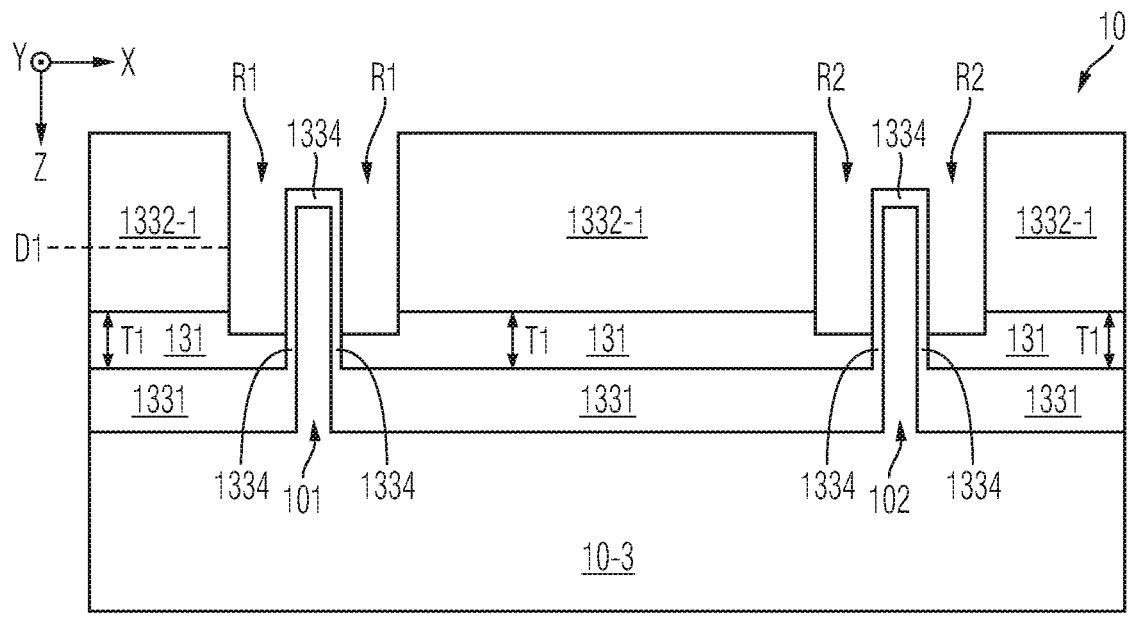

As schematically illustrated in FIGS. 3E, 3E(a), and 3E(b), the exposed portions of the gate electrode layer 131 may then be recessed down to a defined recess depth D1 so as to create recesses R1, R2 adjacent to respective upper portions of the mesas 101, 102 (and centered about the respective mesa 101, 102). This recessing step may be carried out by means of an etch process.

For example, such an etch process may be configured for etching silicon (in the case of a polysilicon gate electrode layer 131) while being selective to the insulation material of the second insulation layer 1332-1 and the gate oxide layer 1334, such that these layers 1332-1, 1334 may not be affected by the recessing step.

It should be noted that the recesses R1, R2 are thus created in a self-aligned manner with respect to the mesas 101, 102, e.g., in the form of side trenches R1, R2 on each side of the mesas 101, 102.

The recess depth D1 defines a vertical gate length of the gate electrode 131 of the power semiconductor device 1 to be produced. For example, the vertical gate length may be adjusted to be different from the gate electrode layer thickness T1, as required.

In one variant embodiment in accordance with FIG. 3E, the recess depth D1 is at the same level as a top edge of the gate electrode layer 131 within a variation of at most 10% of a thickness T1 of the gate oxide layer 1334.

In another variant embodiment, which is schematically illustrated in FIG. 3E(a), the recess depth D1 is located at a higher level than the top edge of the gate electrode layer 131 in the middle between two neighboring mesas 101, 102. Hence, in this variant, the vertical gate length may exceed the gate electrode layer thickness T1.

In yet another variant, which is schematically illustrated in FIG. 3E(b), the recess depth D1 is located deeper than the top edge of the gate electrode layer 131 in the middle between two neighboring mesas 101, 102. Hence, in this variant, the vertical gate length may be smaller than the gate electrode layer thickness T1. In other words, in this case, the recess R1, R2 may define the minimal vertical extension of the gate electrode layer 131.

Figure 3F:
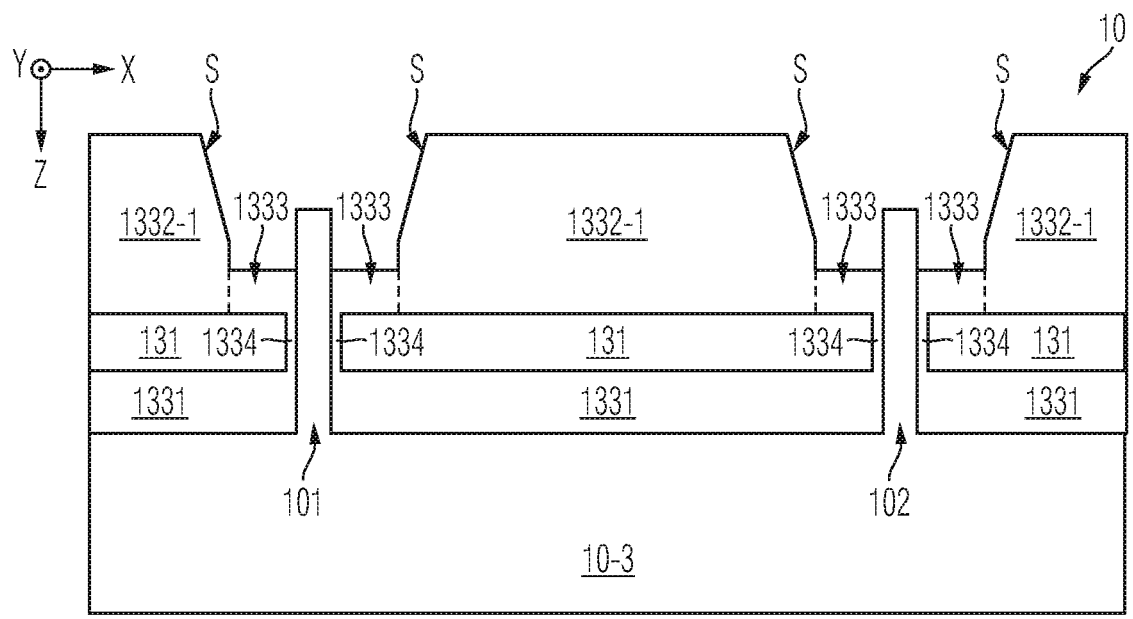

FIG. 3F schematically illustrates a further processing step, which consists in the formation of a third insulation layer 1333 on top of the gate electrode layer 131 inside the recesses R1 R2. The third insulation layer 1333 may also be referred to as an intermediate oxide.

In accordance with an embodiment, the third insulation layer 1333 may be formed by means of an oxide deposition having both sputtering and deposition components, such as by means of a so-called high density plasma deposition (HDP) process. The oxide deposition may be followed by a defined back etch process. For example, as a result, tilted sidewalls S of the recesses R1, R2 may be formed, as illustrated in FIG. 3F.

Alternatively, the recesses R1, R2 may be first completely filled with an oxide or another insulating layer, followed by a CMP planarization and the application of a lithographical mask. Then, a contact etch process, e.g. in the form of a reaction ion etching (RIE) process, may be carried out to define a contact hole and the third insulation layer 1333.

Figure 3G:
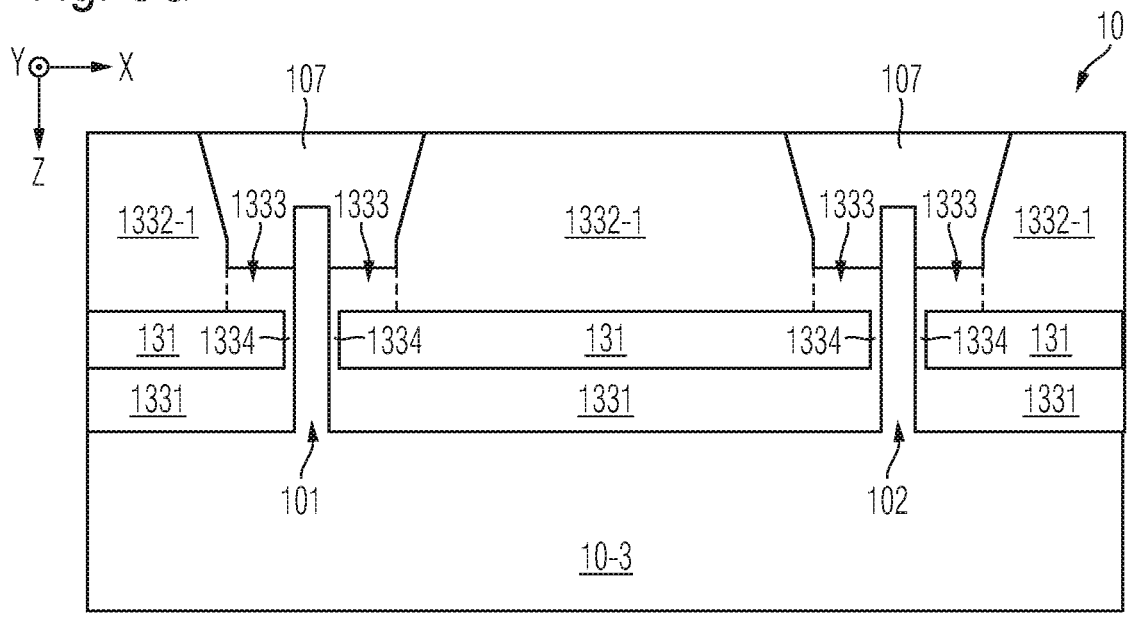

For example, the gate oxide layer 1334 may also be removed from upper ends of one of the mesas 101, 102 during an etch process as mentioned in the preceding paragraphs, or by means of a further (separate) etch process (see FIG. 3G).

As further illustrated in FIG. 3G, the recesses R1, R2 may then be filled with a semiconductive material so as to form a contact plug 107. For example, this step may comprise a deposition of polysilicon, optionally followed by a CMP planarization step. Alternatively, for example, a selective epitaxy of silicon may be carried out, which may be followed by a back etch process.

After the filling step, the semiconductive material may be doped, e.g. by means of an implantation of dopants of the first conductivity or of the second conductivity type, as required.

In another embodiment, the recesses R1, R2 may be filled with a metal instead of a semiconductive material.

Figure 3H:
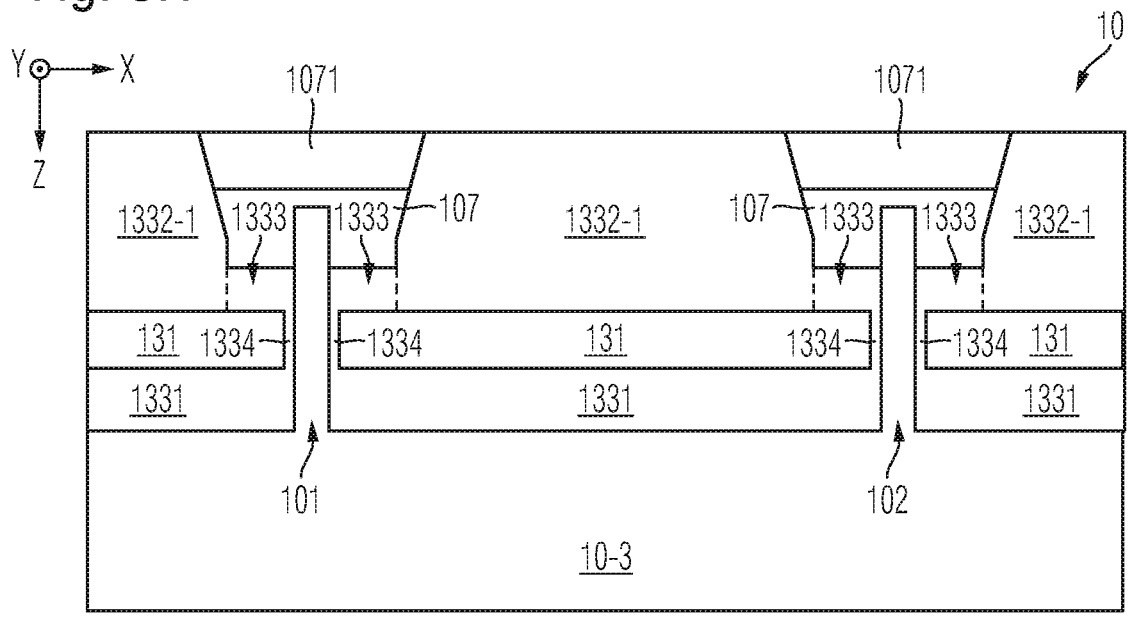

Further, the method may comprise siliciding a surface portion of each of the contact plugs 107 so as to form silicided contact portions 1071 (see FIG. 3H). For example, the silicided contact portions 1071 may comprise at least one of titanium disilicide (TiSi2), cobalt disilicide (CoSi2), and nickel disilicide (NiSi2), The silicide formation may, for example, comprise a process sequence including a deposition of a suitable metal, a rapid thermal anneal (RTA), a wet etch, and another RTA.

For finishing the processing of the power semiconductor device 1, further steps, such as another oxide deposition, a contact formation, structuring of a front side metallization, a deposition of a polyimide etc, may be carried out, Such steps are as such well known in the art and are therefore not illustrated or explained in detail here.

The formation of doped contact regions 1011, 1021 of the mesas 101, 102 (cf. FIGS. 1A-2B) is also not explicitly illustrated in FIGS. 3A-H. The contact regions 1011, 1021 may be formed by methods which are as such well known, e.g., by means of ion implantation, plasma doping or solid phase outdiffusion using lithography masks.

Figure 4A:
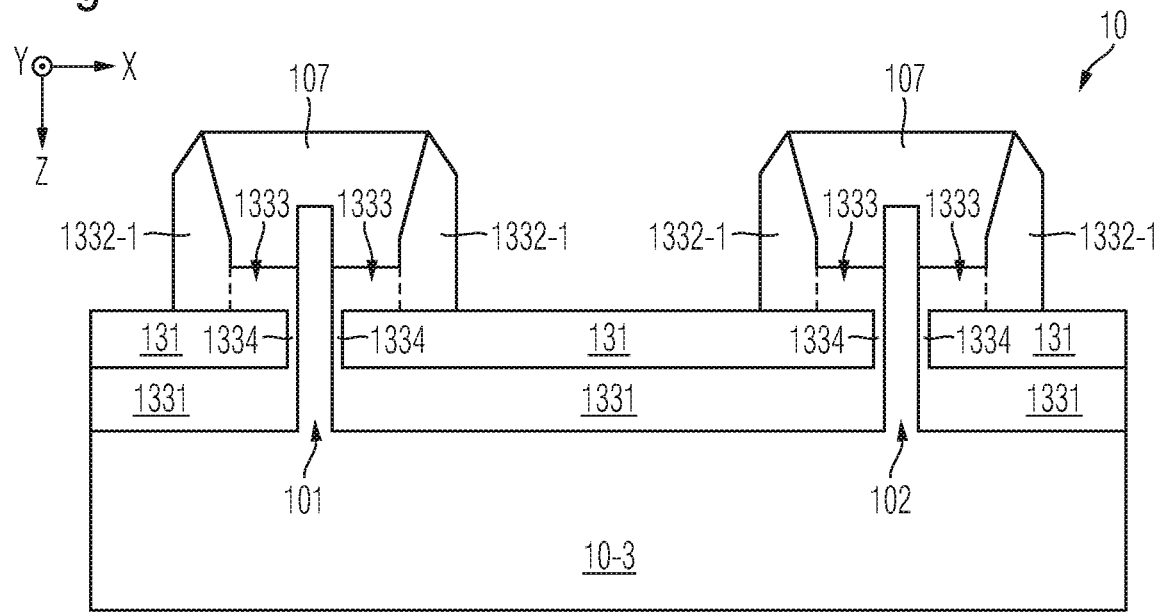
FIGS. 4A-4C schematically and exemplarily illustrate further processing steps of a method in accordance with one or more embodiments.
Figure 4B:
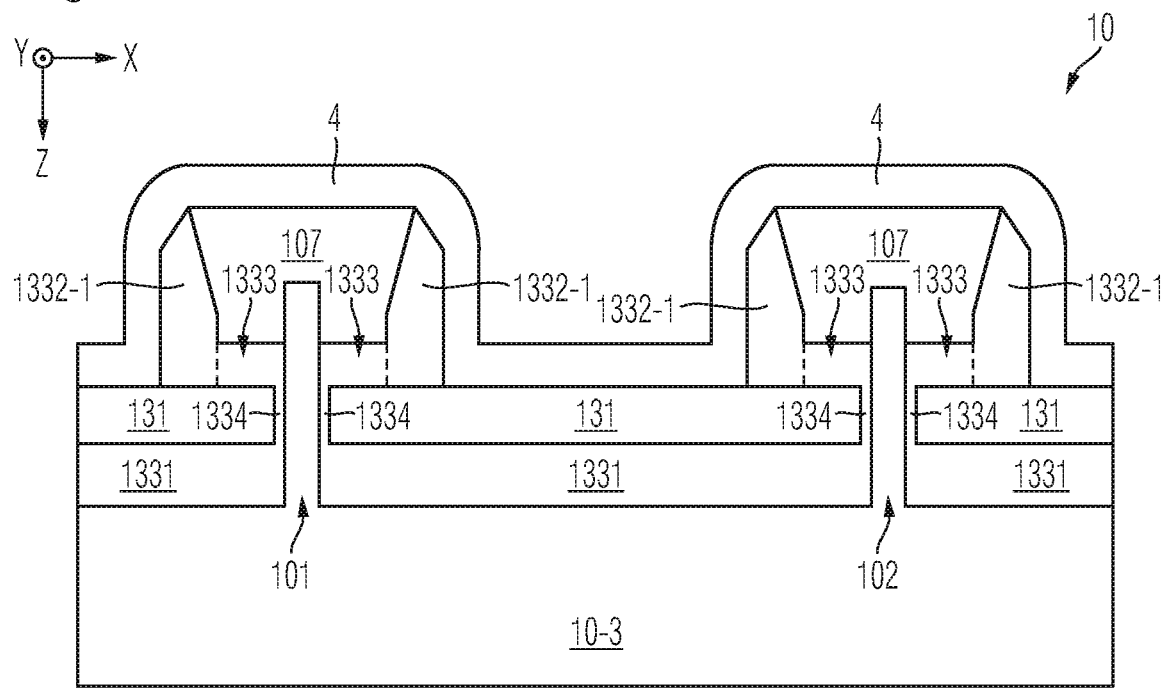
Figure 4C:
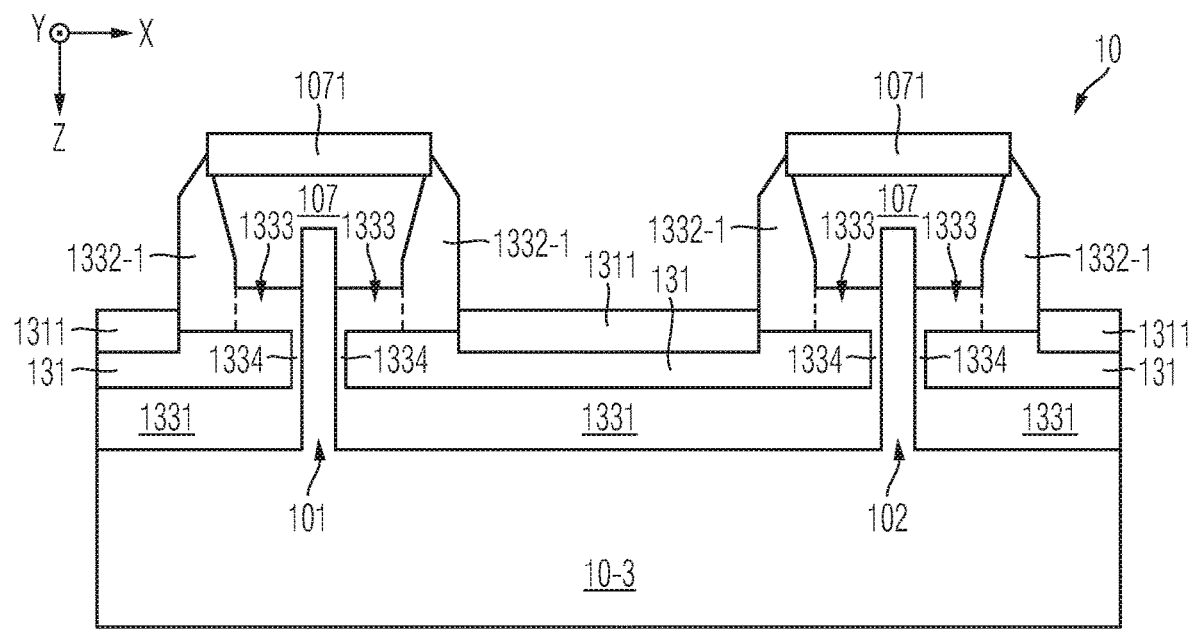

FIGS. 4A-C schematically illustrate steps of a process variant which allows for creating silicided control electrode portions 1311 of the kind that have been described above with reference to FIG. 2B. In this case, the gate electrode layer 131 is a polysilicon layer.

For example, after the process step of forming the contact plugs 107, which has been explained above with reference to FIG. 3G, portions of the second insulation layer 1332-1 may be removed so as to expose portions of the polysilicon layer 131 (see FIG. 4A). This step may comprise an etch process, wherein the contact plugs 107 (which may consist, e.g., of polysilicon) are used as a hard mask. For example, remaining portions of the second insulation layer 1332-1 may form oxide spacers on each side of the contact plug 107 as a result of the etch process, which may hence also be referred to as a "spacer etch" process.

The exposed portions of the polysilicon layer 131 may then be silicided. This may be accomplished in a similar way as described above in connection with FIG. 3H and the polysilicon contact plugs 107. Accordingly, the silicide formation may, for example, comprise a process sequence including a deposition of a suitable metal 4 (see FIG. 4B), a rapid thermal anneal (RTA), a wet etch, and another RTA.

As schematically illustrated in FIGS. 4B-C, the siliciding of the surface portions of the contact plugs 107 and of the exposed portions of the polysilicon layer 131 may thus be carried out in one or more shared processing steps (such as the deposition of the metal layer 4). It should be noted that the silicide may be formed on exposed polysilicon surfaces, but not on oxides, such as the oxide spacers 1332.

For example, as already mentioned in connection with FIG. 3H, the resulting silicided portions 1071 of the contact plugs 107 and the silicided control electrode portions 1311 may comprise at least one of titanium disilicide (TiSi2), cobalt disilicide (CoSi2), and nickel disilicide (NiSi2).

FIGS. 5A-B each schematically and exemplarily illustrate a section of a horizontal cross-section of a power semiconductor device 1 in accordance with one or more embodiments, such as the embodiments described above with reference to FIGS. 1A-2B. For example, FIGS. 5A-B may show horizontal cross-sections through two different variant embodiments of the power semiconductor device 1 in accordance with FIGS. 2A-B, wherein the cross-section is in each case at a (vertical) level of the control electrode 131.

In the variant embodiment illustrated in FIG. 5A, the mesas 101, 102 are formed as elongated fins having their main horizontal extension in the second lateral direction Y. For example, the mesas may have a length L in said direction, wherein the length L may be, e.g., in the range from 1 µm to 100 µm. The mesa width W1 may be much smaller, such as in the range from 20 nm to 60 nm, as mentioned earlier.

By contrast, in the variant embodiment illustrated in FIG. 5B, the mesas 101, 102 are formed as pillars having a quadratic cross-section. In other embodiments, which are not illustrated, such pillars may instead have a round cross-section, such as a circular cross-section.

In both variant embodiments according to FIGS. 5A and 5B, the mesas 101, 102 are laterally surrounded by the gate oxide layers 1334 and the gate electrodes 131 from each side. In other words, the mesas 101, 102 are embedded in the respective gate electrode 131 while being separated from the gate electrode 131 by means of the gate oxide layers 1334.

With regard to the spatial arrangement of first mesas 101 and second mesas 102, it should be noted that FIGS. 5A-B are merely examples. Different relative arrangements of first mesas 101 and second mesas 102 are possible.

FIGS. 6A-D each schematically and exemplarily illustrate a top view of a relative arrangement of an exemplary mesa 101 and a contact plug 107 in accordance with one or more embodiments. In each case, the mesa 101 has an elongated fin configuration and the contact plug(s) 107 is/are indicated by means of one or more dashed rectangles.

For example, in accordance with FIG. 6A, the contact plug 107 may overlap the mesa 101 on all four sides (cf. FIG. 1A and the corresponding description referring, e.g., to the lateral contact C and the vertical overlap H4). Here, one large contact plug 107 forms a single large contact with the mesa 101. For example, with such a layout, a relatively small contact resistance may be achieved.

For example, the contact plug 107 may be centered precisely on the mesa 101 with respect to the first horizontal direction X. This centered arrangement may, for example, result automatically from a self-aligned processing method as described above with reference to FIGS. 3A-4C, FIG. 6B show a variant wherein, again, one large contact plug 107 forms a single large contact with the mesa 101. However, in contrast to FIG. 6A, the contact plug 107 overlaps the mesa 101 only on two sides.

In the variant embodiment that is illustrated in FIG. 6C, multiple smaller contact plugs 107 are provided, wherein each contact plug 107 overlaps the mesa 101 on two sides.

Finally, in the exemplary embodiment illustrated in FIG. 6D, there is no vertical overlap of the contact plug 107 and the mesa 101 at all.

In the above, embodiments pertaining to power semiconductor devices and corresponding processing methods were explained.

For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary Ill-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a power semiconductor device, the method comprising:
    providing a semiconductor body having a drift region comprising dopants of a first conductivity type, the drift region configured to support a load current flow along a vertical direction which is parallel to a normal direction of a surface of the semiconductor body;

recessing portions of the semiconductor body so as to create a plurality of mesas protruding from the drift region;

forming a first insulation layer on the drift region in between the mesas;

forming a gate oxide layer on the mesas;

depositing a gate electrode layer on the first insulation layer and on the gate oxide layer;

after both forming the gate oxide layer and depositing the gate electrode layer, forming a second insulation layer filling a space between neighboring mesas and such that portions of the gate electrode layer are exposed at a level above the mesas; and recessing the exposed portions of the gate electrode layer down to a defined recess depth so as to create recesses adjacent to respective upper portions of the mesas.

2. The method of claim 1, wherein the recess depth is located deeper than a top edge of the gate electrode layer.

3. The method of claim 1, wherein the recess depth is located at a same level as a top edge of the gate electrode layer within a variation of at most 10% of a thickness of the gate oxide layer.

4. The method of claim 1, wherein the recess depth is located at a higher level than a top edge of the gate electrode layer in the middle between two neighboring mesas.

5. The method of claim 1, wherein a layer thickness of the deposited gate electrode layer is equal to or smaller than one third of a mesa height of the mesas.

6. The method of claim 1, further comprising:

forming a third insulation layer on top of the gate electrode layer inside the recesses.

7. The method of claim 6, wherein the third insulation layer is formed by an oxide deposition having sputtering and depositing components.

8. The method of claim 1, further comprising:

removing the gate oxide layer from upper ends of one of the mesas by an etch process.

9. The method of claim 1, further comprising filling the recesses with a metal.

10. The method of claim 1, further comprising:

filling the recesses with a semiconductive material so as to form a contact plug.

11. The method of claim 10, further comprising:

siliciding a surface portion of each of the contact plugs so as to form silicided contact portions.

12. The method of claim 10, wherein the gate electrode layer is a polysilicon layer, and wherein the method further comprises:

removing a portion of the second insulation layer so as to expose portions of the polysilicon layer; and siliciding the exposed portions of the polysilicon layer.

13. The method of claim 12, wherein removing the portion of the second insulation layer comprises an etch process, and wherein the contact plugs are used as a hard mask.

14. The method of claim 12, wherein siliciding the surface portions of the contact plugs and of the exposed portions of the polysilicon layer is carried out in one or more shared processing steps.

* * * * *